United States Patent [19]

Hasegawa et al.

[11] Patent Number: 5,174,067
[45] Date of Patent: Dec. 29, 1992

[54] AUTOMATIC WAFER LAPPING APPARATUS

[75] Inventors: Fumihiko Hasegawa, Urawa; Hiromasa Hashimoto, Fukushima, both of Japan

[73] Assignee: Shin-Etsu Handotai Co., Ltd., Tokyo, Japan

[21] Appl. No.: 779,474

[22] Filed: Oct. 18, 1991

[30] Foreign Application Priority Data

Oct. 19, 1990 [JP] Japan .................................. 2-108940
Oct. 19, 1990 [JP] Japan .................................. 2-278943

[51] Int. Cl.⁵ .............................................. B24B 37/04
[52] U.S. Cl. .................................. 51/133; 51/215 M; 51/215 UE; 414/217; 414/416; 414/222
[58] Field of Search .................. 51/111 R, 117, 118, 51/131.1, 131.3, 132, 133, 134, 215 AR, 215 UE, 215 CP, 215 H, 215 HM, 240 A, 240 T, 129, 237 T, 109 R; 414/217, 416, 222

[56] References Cited

FOREIGN PATENT DOCUMENTS 0223561 12/1983 Japan .................................. 51/283 R
0241060 10/1986 Japan .................................. 51/131.3
0120077 5/1988 Japan .................................. 51/133
0140960 6/1989 Japan .................................. 51/131.3

Primary Examiner—Robert A. Rose
Attorney, Agent, or Firm—Lowe, Price, LeBlanc & Becker

[57] ABSTRACT

An automatic wafer lapping apparatus in which a pair of turntable stages are provided which each have a vertical central shaft and a pin on which the wafer carriers are spitted and piled up; furthermore, the teeth of the sun gear and the internal gear of the lapping assembly are bevelled at their upper portions in a manner such that the upper end of each tooth is tapered and converge into a linear ridge so as to facilitate automatic and prompt meshing of the carriers inbetween them.

2 Claims, 4 Drawing Sheets

AUTOMATIC WAFER LAPPING APPARATUS

BACKGROUND OF THE INVENTION

The present invention relates to an automatic wafer lapping apparatus for automatically lapping the surfaces of wafers such as a semiconductor wafer.

PRIOR ART

For example, in the semiconductor manufacturing field, a semiconductor wafer which is made into substrates for semiconductor devices is obtained from a single crystal ingot, such as one grown of silicon, by slicing the ingot in a direction normal to the axis of the ingot to thereby yield thin discs, which are then lapped, etched and given other treatments.

Of these treatments the lapping treatment of the semiconductor wafers is conducted so as to remove irregularity from the wafer surfaces by means of a lapping apparatus to the extent that the surfaces become glossy. A lapping apparatus typically comprises a set of planetary gears (hereinafter merely referred to as "carriers") which carry wafers, an upper lapping plate, and a lower lapping plate equipped with a sun gear (drive gear) in the center and an internal gear along the circumference. Bores shaped exactly like the wafers are made through each carrier, and as many wafers as the bores are fitted therein in each carrier. Then, the carriers loaded with the wafers are set on the lower lapping plate in a manner such that they are in mesh with both the sun gear and the internal gear. As the sun gear is driven to rotate, the carriers are caused to undergo a planetary movement around the sun gear between the upper and lower lapping plates whereby the surfaces of the wafers are ground and polished with the polishing powder held on the polishing faces of the upper and lower lapping plates.

Conventionally, the setting of the semiconductor wafers in the carriers, the setting of the wafer-loaded carriers on the lower lapping plate, and the removal of the carriers from the lower lapping plate and the lapped wafers from the carriers after the lapping operation were all tasks of a manual operator; these operations require experience and skill and, as is often the case with the performances where a human's physical skill is employed, it is impossible to improve the efficiency and the speed of the performance beyond certain levels.

Hence, automatization of the lapping operations has been desired and various automatic apparatuses have been proposed. For example, Japanese First Patent Publication Kokai No. 61-76269 (1986) teaches an automatic wafer lapping apparatus wherein a carrier setter and retriever means and a wafer setter and retriever means are provided in the vicinity of the lapping plates, the latter for automatically setting the wafers on and removing the same from the carriers, and the former for automatically setting the carriers on and removing the same from the lower lapping plate.

PROBLEMS THE INVENTION SEEKS TO SOLVE

However, in the automatic lapping apparatuses which have been proposed so far, the carrier setter and retriever means does not necessarily place a carrier in the right position where the carrier ought to get in mesh with the sun gear and the internal gear simultaneously; that is, it sometimes occurs that the teeth of the carrier collide with the teeth of the sun gear and the internal gear, so that the manual operator still has to watch over the operation of the carrier setter and retriever means and whenever it fails to set a carrier aright, the operator has to adjust the carrier by hand until it meshes groovily with the sun gear and the internal gear.

Also, in the case of the automatic wafer lapping apparatus such as the one explained above by way of an example, a plurality of wafers (usually five wafers) are placed apart from each other on a single plate of the wafer setter and retriever means, so that a large space is occupied by this means, and since no preparation is made for the next set of the wafers until all the wafers of the presently served set are lapped, the cycle time is considerably long and thus the time efficiency of the operation is low.

It is, therefore, an object of the invention to provide an automatic wafer lapping apparatus wherein a planetary gear as a wafer carrier meshes automatically with the sun gear and the internal gear of the lapping assembly without being interfered by them.

It is also an object of the invention to provide an automatic wafer lapping apparatus which occupies only a small space, and operates efficiently so that the number of the wafers that can be lapped within a certain time period is greatly increased.

SUMMARY OF THE INVENTION

Means to solve the Problems

In order to attain the objects of the invention, an improved automatic wafer lapping apparatus is proposed. This automatic wafer lapping apparatus is the same as the conventionally employed ones in that it also has (a) a lapping assembly consisting mainly of an upper lapping plate, a lower lapping plate, a sun gear at the center of the lower lapping plate, and an internal gear along the circumference of the lower lapping plate, (b) a plurality of wafer carriers which are planetary gears adapted to mesh with the sun gear and the internal gear simultaneously, (c) a pair of loader assemblies each consisting mainly of a wafer storage to store wafers, and a wafer picker and setter means for picking wafers from the wafer storage and setting them in the wafer carriers, (d) a wafer carrier setter means for setting the wafer carriers at proper positions in the lapping assembly; and (e) an unloader assembly consisting mainly of a wafer recovery subassembly for recovering the wafers, and a wafer carrier picker means for picking the wafer carriers from the lapping assembly and discarding them into the wafer recover subassembly.

The automatic wafer lapping apparatus of the invention differs from the conventional apparatuses in that each of the loader assemblies further comprises a turntable stage where the wafer carriers are piled up by the wafer carrier setter means and loaded with wafers by the wafer picker and setter means, the turntable stage having a vertical central shaft and a pin on which the wafer carriers are spitted.

Also, according to the invention, said wafer carrier setter means of said loader assemblies and said wafer carrier picker means of said unloader assembly are one and the same means.

Furthermore, according to the invention, the teeth of said sun gear and the internal gear of said lapping assembly are bevelled at their upper portions in a manner such that the upper end of each tooth is tapered and converge into a linear ridge.

Preferably, said linear ridge slopes downward toward the lateral end of the tooth.

Effects of the Invention

According to the invention, a plurality of wafer carriers are piled one on top of another at the turntable stages, the area taken by the waiting carriers or the emptied carriers is no more than that of one carrier so that it is possible to make compact the lapping apparatus.

Also, according to the invention since there is provided only one robot for setting the wafer carriers on the lower lapping plate, removing the wafer carriers from the lower lapping plate, and discarding them in the wafer recovery subassembly, the installation space can be smaller yet.

Furthermore, since the wafer carriers are loaded with wafers at the turntable stages while the wafers are lapped in the lapping assembly, the loss time is reduced and it is possible to increase the number of wafers lapped in a certain time period.

Also, according to another aspect of the invention, since the teeth of the sun gear and the internal gear are bevelled as described above, the wafer carriers when placed in the appropriate position mech automatically and promptly with the sun gear and the internal gear, there is no need for anyone to watch over the carier setting operation.

Next, an embodiment of the automatic wafer lapping apparatus of the invention will be described in detail with reference to the attached drawings.

EMBODIMENT

Figure 1:
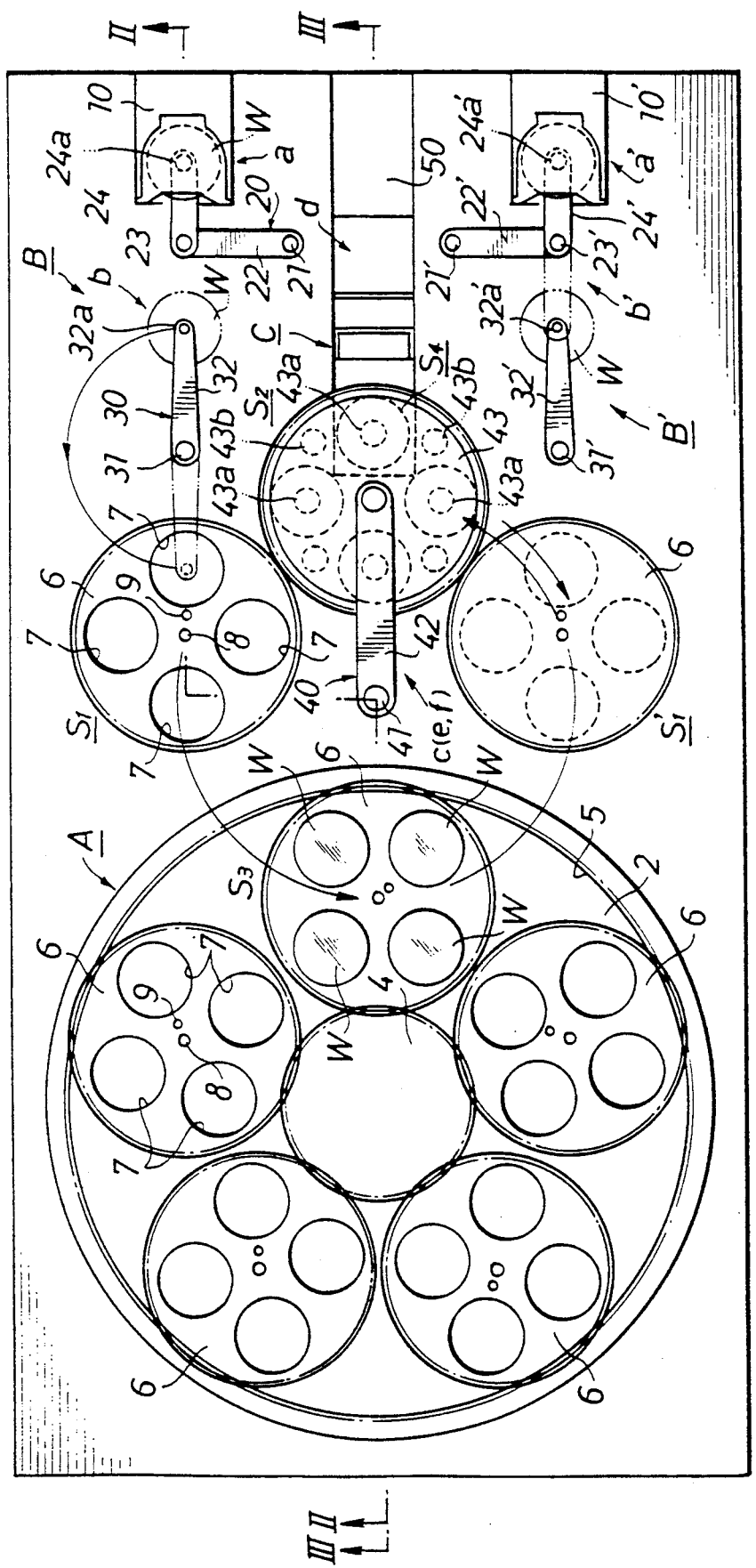
FIG. 1 is a plan view of an automatic wafer lapping apparatus of the invention.

As shown in FIG. 1, an automatic wafer lapping apparatus of the invention mainly consists of a lapping assembly A, two series of loader assemblies B, B' installed in the vicinity of the lower lapping plate 2, and a series of unloader assembly C.

Figure 3:
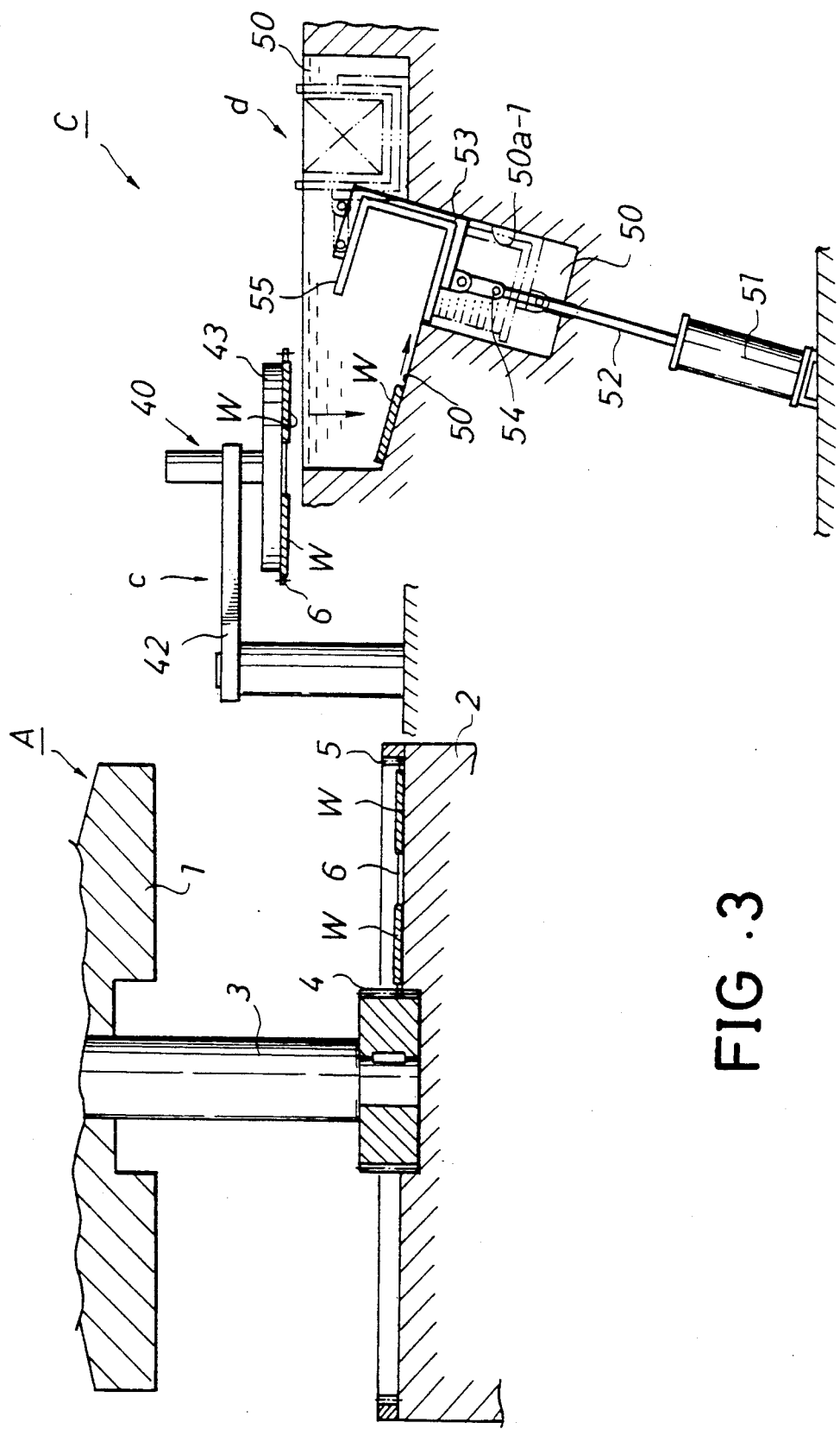
FIG. 3 is a cross section taken on the line III—III of FIG. 1.
Figure 4A:
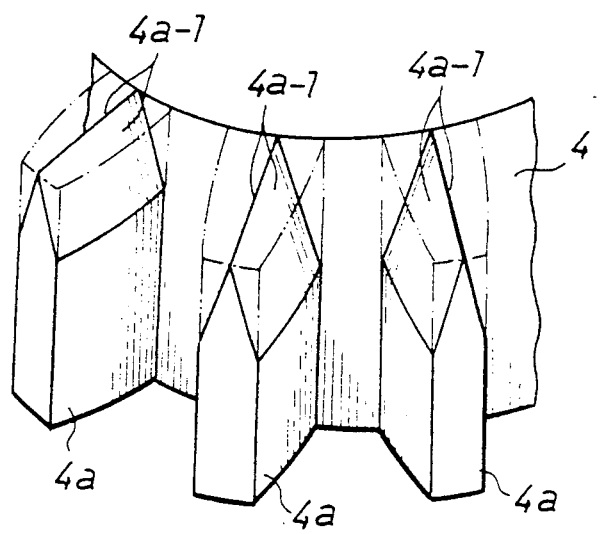
FIG. 4a is a perspective view of a part of a sun gear, showing the manner of how its teeth surfaces are bevelled.

As shown in FIG. 3, the lapping assembly A comprises an upper lapping plate 1 and a lower lapping plate 2, the former being capable of sliding vertically along a vertical cylindrical shaft 3, and of turning about the same shaft 3 freely. A sun gear 4 which constitutes the drive gear is provided in the center of the lower lapping plate 2, and an internal gear 5 is provided along the circumference of the lower lapping plate 2. Incidentally, all of the vertical teeth 4a of the horizontally installed sun gear 4 are chamfered and bevelled at their upper portions in a manner as shown in FIG. 4a such that the upper end of each tooth 4a is tapered into a ridge of a line which slopes downward toward the lateral end of the tooth 4a. Sloping faces 4a-1 of the teeth 4a, which meet and form the ridge lines at the top, function as the guide for the teeth of the carrier 6 to enter the grooves of the sun gear 4 to thereby properly interlock with the teeth 4a of the sun gear 4.

Figure 4B:
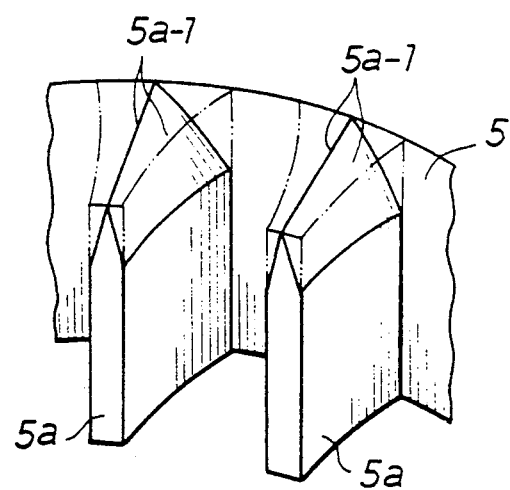
FIG. 4b is a perspective view of a part of an internal gear, showing the manner of how its teeth surfaces are bevelled.

Similarly, all of the teeth 5a of the circumferentially arranged internal gear 5 are chamfered and bevelled at their upper portions in a manner as shown in FIG. 4b so that the upper end of each tooth 5a is tapered into a linear ridge which slopes downward toward the lateral end of the tooth 5a. Sloping faces 5a-1 of the teeth 5a function as the guide for the teeth of the incoming carrier 6 to interlock with the teeth 5a of the internal gear 5.

As shown in FIG. 1, five carriers 6, which are planetary gears, are set between the sun gear 4 and the internal gear 5 in a manner such that the centers of the carriers 6 form a right pentagon and that none of the carriers 6 are in contact with the neighboring ones. Each carrier 6 has four penetrating circular bores 7 having the same diameter as the wafers W so as to hold the wafers W therein and are positioned such that the centers of the circular bores 7 form a square of which the center coincides with the center of the carrier 6. A small circular bore 8 is made in the center of each carrier 6, and an even smaller circular bore 9 is made at a location close to the central bore 8 and such that the line passing the centers of the bores 8 and 9 also passes the centers of the two of the four bores 7 which oppose each other.

When the five carriers 6 are fitted properly in the lower lapping plate 1, and the upper lapping plate 2 is lowered upon the lower lapping plate 1, the wafers W are sort of sandwiched between the lapping plates 1, 2 of the lapping assembly A. Then, the sun gear 4 is driven to rotate whereupon the carriers 6 start revolving both round the sun gear 4 and about their respective centers. Thus, the upper and lower faces of the wafers W are lapped by the lapping faces of the upper and lower lapping plates 1, 2.

Figure 2:
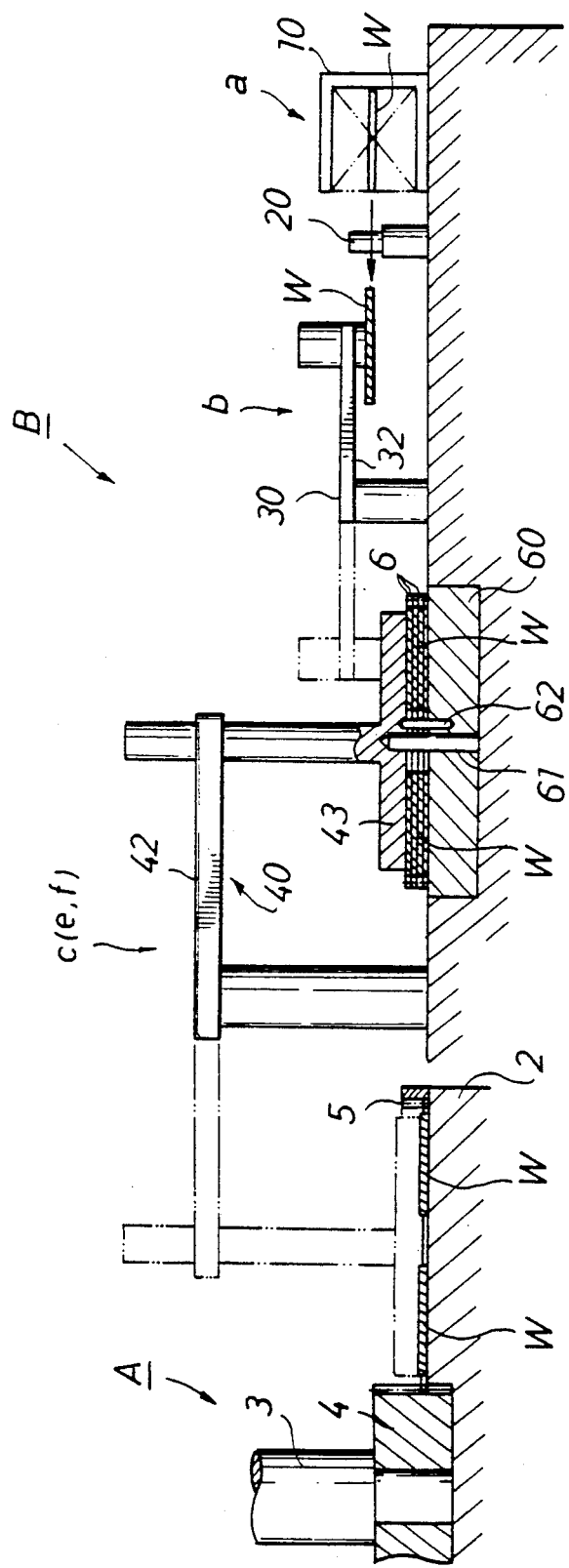
FIG. 2 is a cross section taken on the stepped line II—II of FIG. 1.

Next, the construction of the loader assembly B will be described with reference to FIGS. 1 and 2.

The loader assembly B mainly consists of a wafer storage a, a wafer picker and setter means b and a carrier setter means c. The wafer storage a includes a wafer cassette 10 for storing a predetermined number (twenty in this embodiment) of the wafers W in the form of a vertical pile, as shown in FIG. 2. The wafer picker and setter means b consists of swing arm robots 20 and 30, as shown in FIG. 1. The swing arm robot 20 has a first arm 22, which swings horizontally about a shaft 21, and a second arm 24, which swings horizontally about a shaft 23, which is provided at the fore end of the first arm 22. A vacuum sucker 24a opening upward is provided at the fore end of the second arm 24. The swing arm robot 30 has an arm 32, which swings horizontally about a shaft 31, and a vacuum sucker 32a opening downward is provided at the fore end of the arm 32.

The construction of the loader assembly B' is exactly the same as that of the loader assembly B except that the swing arm robots of the loader assembly B are right-handed while those of the loader assembly B' are left-handed. Therefore, all the corresponding members of the assembly B' are designated by the like reference numerals with a prime attached to each of them, and the description of them are omitted. Incidentally, the loader assembly B' shares the carrier setter means c with the loader assembly B as a common constituent.

Between these loader assemblies B, B' is installed the carrier setter means c, which consists of a swing arm robot 40, which has an arm 42 which swings horizontally about a shaft 41, and a horizontal disc-shaped vacuum sucking plate 43 which is capable of being turned about its center, where it is pivotally connected to the fore end of the arm 42. As shown in FIG. 1, the vacuum sucking plate 43 has four circular vacuum suckers 43a opening downward for adsorbing the wafers W, the vacuum suckers 43a being arranged in a manner such that the centers of the circular vacuum suckers 43a form a square whose center coincides with the center of the vacuum sucking plate 43. Similarly four suckers 43b opening downward for adsorbing the carrier 6 are provided in the vacuum sucking plate 43 in a manner such that the centers of the suckers 43b form a square and each of the diagonals of this square forms an angle of 45° with the diagonals of the square formed by the centers of the suckers 43a.

Next, the construction of the unloader assembly C will be described with reference to FIGS. 1 and 3.

The unloader assembly C also shares the carrier setter means c as a common constituent with the loader assemblies B, B', and further consists of a wafer recovery assembly d. Incidentally, the carrier setter means c is double-functional, constituting at the same time (i) a carrier picker and mover means e for picking the carriers 6 from the lapping assembly A one by one and moving them to the wafer recovery assembly d, and (ii) a wafer picker and discarder means f for picking the wafers W from the carriers 6 one by one and discarding them into the wafer recovery assembly d. The wafer recovery assembly d includes a water tank 50 which is filled with water and provided with a deep recess 50a in the shape of a tilted square pole in the bottom, a sloping shelf 50b which is sloped toward the recess 50a by a sufficient angle so that a wafer W that is let down on the shelf 50b slides by itself and enters the recess 50a, and a horizontal shelf.

In the recess 50a is disposed the fore end of a rod 52 extending from an air cylinder 51 installed on the ground. To the fore end of the rod 52 is attached a wafer cassette holder member 53 having a longitudinal cross section resembling a Greek letter "π", and the holder member 53 has its neck connected to the rod 52 by means of a shaft 54 about which the neck of the holder member 53 swings so that the holder member 53 can nod freely. The holder member 53 holds in it a wafer cassette 55, which is disposed and adapted to receive wafers W in it as they slide down along the sloping shelf 50b one after another. The holder member 53 and the cassette 55 are constructed in a manner such that when they are assembled together they fit in the square recess 50a and can slide therein with the neck erected because they are supported by a sloping guide wall 50a-1, but when they are raised and entirely out of the recess 50a, the holder member 53 is no longer supported by the guide wall 50a-1 whereupon the neck is bent at the shaft 54 so that the holder member 53 with the cassette 55 lie squarely on the horizontal shelf of the water tank 50 (ref. broken line in FIG. 3).

As shown in FIG. 1, three stages S1, S1' and S2 are provided at appropriate positions where the arm 42 of the swing arm robot 40 can conveniently reach. Also, as shown in FIG. 2, a disc-shaped turntable 60 is installed on the stage S1; also one on the stage S1', too. A vertical shaft 61 is provided to penetrate, and protrude upward from, the turntable 60 at the center thereof, and also a pin 62 is provided to protrude vertically from the turntable 60 in the vicinity of the center thereof; similarly, the same elements are provided at the stage S1'.

Next, the operation of this automatic wafer lapping apparatus will be explained.

Prior to the operation, five carriers 6 are piled on the turntable 60 at the stage S1 in a manner such that each carrier 6 is spitted by the shaft 61 and the pin 62 through the central bore 8 and the pin bore 9, respectively. As the positions of these bores 8, 9 in relation to the four wafer bores 7 are the same among all the carriers 6, the carriers 6 thus piled on the turntable 60 have the same phase orientation so that the circular bores 7 form four vertically penetrating circular holes in the pile. Similarly as at the stage S1, five carriers 6 are also piled on the turntable at the stage S1'.

When the carriers 6 are thus stacked on the turntable 60 at the stage S1, the swing arm robot 20 is driven to pick up the lower-most one of the wafers W from the cassette 10, in which a number of wafers W are stored. Incidentally, the picking is done by drawing air sharply through the vacuum sucker 24a whereby the wafer W is adsorbed to the vacuum sucker 24a. The swing arm robot 20 then swings its first arm 20 about the shaft 21 and the second arm about the shaft 23 until the wafer W comes in a new position which is drawn by two-dot chain line in the upper right of FIG. 1, where the end portion of the swing arm robot 30 is disposed, as drawn by solid line there. Now, the swing arm robot 20 hands the wafer W to the swing arm robot 30, which is effected as the vacuum sucker 24a of the swing arm robot 20 ceases to suck the air while the vacuum sucker 32a of the swing arm robot 30 starts sucking the air. Exactly speaking, at this time the center of the vacuum sucker 24a comes precisely below the center of the vacuum sucker 32a, which is more clearly seen at the lower right of FIG. 1 where the swing arm robot 20' is seen to be handing a wafer W to the swing arm robot 30'. After having given away the wafer W, the swing arm robot 20 turns its arms back toward the wafer cassette 10. Incidentally, when the lower-most wafer is taken away from the cassette 10, the racks in the cassette 10 shift downward by one pitch so that the currently lower-most wafer is posed at the same height as the previously lower-most wafer was posed, so as to prepare the currently lower-most wafer to be readily picked up by the swing arm robot 20.

Now, the swing arm robot 30 having possessed the wafer W swings its arm 30 counterclockwise about the shaft 31 through an angle of 180°, as shown by the semicircular arrow, to assume a new position drawn by two-dot chain line in FIG. 1. It is so designed that when the arm 30 assumes this new position, the wafer W held by the arm 30 entirely covers up one of the holes formed by the bores 7 of carriers 6 at the stage S1. The swing arm robot 30 descends its arm 32 and inserts the wafer W in that hole and sets it in the bore 7 of the lower-most carrier 6 which defines the lowest portion of said hole. Then, the vacuum sucker 32a ceases to suck and leaves the wafer W there, and the swing robot 30 ascends and then returns to its former position to wait for the next wafer W. Thus, in the same manner as described immediately above, a second wafer W is taken from the cassette 10 and brought into the empty bore 7 of the second-lowest carrier 6 at the stage S1. When this operation is repeated five times, the first hole, that is the hole defined by the five bores 7 of the same phase, is filled with five wafers W.

Then, the turntable 60 is turned by a predetermined angle (90° in this embodiment) whereby another hole formed of five empty bores 7 of the same phase of the carriers 6 is moved to the position which was formerly assumed by the hole already loaded with the first five wafers W.

When this series of operation is repeated four times and all the bores 7 of the carriers 6 are loaded, that is, when twenty wafers W are held by the carriers 6, the swing arm robot 40 is driven to swing its arm 42 about the axis 41 until the vacuum sucking plate 43 supported by the arm 42 covers up the upper-most carrier 6 at the stage S1. Then, the vacuum suckers 43a and 43b start sucking the air whereby the upper-most carrier 6 together with the four wafers W are adsorbed to the vacuum sucking plate 43. Thereafter, the arm 42 is swung counterclockwise about the shaft 41 until the vacuum sucking plate 43 at the end of the arm 42 arrives at a predetermined position over a position S3 of the lapping assembly A, where the vacuum suckers 43a and 43b of the vacuum sucking plate 43 stop sucking and the carrier 6 and the wafers W are let down onto the lower lapping plate 2 exactly between the sun gear 4 and the internal gear 5.

The carrier 6 automatically meshes with the sun gear 4 and the internal gear 5 and promptly assumes the position S3 on the lower lapping plate 2. This automatic meshing of the carrier 6 with the sun gear 4 and the internal gear 5 is facilitated by the sloping faces 4a-1 of the upwardly tapered teeth 4a of the sun gear 4 and the sloping faces 5a-1 of the upwardly tapered teeth 5a of the internal gear 5 (ref. FIGS. 4a and 4b). The sloping faces 4a-1 and 5a-1 function as the guides for the teeth of the carrier 6 to enter the grooves of the gears 4, 5 to thereby get engaged with the teeth 4a and 5a. Thus, on no occasion will the carrier 6 be suspended askance between the sun gear 4 and the internal gear 5.

When the carrier 6 is set properly in the position S3 on the lower lapping plate 2, the lower lapping plate 2 is turned by an angle of 72° about the center thereof. Meanwhile, the swing arm robot 40 turns back to the stage S1 and takes the next upper-most carrier 6 together with four wafers W in the same manner as described above, and again places the carrier 6 onto the lower lapping plate 2 at the position S3. When this series of operation is repeated five times, the lower lapping plate 2 is fully loaded with the five carriers 6, which each are all loaded with four wafers W. Thus, twenty wafers W are ready to be lapped.

When the arm 40 of the swing arm robot 40 is swung away from the lapping assembly A, the upper lapping plate 1 is lowered along the shaft 3 until its lapping face comes in contact with the wafers W. Then, the lapping assembly A is operated and the sun gear 4 starts turning about its axis, which causes the carriers 6 to revolve both round the sun gear 4 and about their respective centers; consequently, the upper and the lower faces of the twenty wafers W are lapped by the lapping faces of the upper and lower lapping plates 1, 2.

During this lapping operation, the empty carriers 6 piled at the stage S1' are loaded with the wafers W in the same manner as the carriers 6 at the stage S1 were loaded.

When the lapping operation of the lapping assembly A is completed, the upper lapping plate 1 is lifted up along the shaft 3 (ref. FIG. 3), and the lower lapping plate 2 is turned until one of the wafers W comes to assume the position S3. Then, the swing arm robot 40 turns its arm 42 and takes the carrier 6 together with the four lapped wafers W from the position S3 of the lower lapping plate 2, and, by turning around clockwise, brings them to a stage S2. The manner of the swing arm robot 40 of picking up the carrier 6 and the wafers W from the position S3 is the same as that in which it picked up the carriers 6 and the wafers W from the stage S1. At the stage S2, the sucking plate 43 is turned about its center until one of the wafers W sucked thereto is brought into a position S4, shown in FIG. 1. Then, only that vacuum sucker 43a which is sucking the wafer W in the position S4 is caused to stop sucking, whereby the said wafer W is let down into the water contained in the water tank 50 (FIG. 3). When the wafer W reaches the sloping shelf 50b, the wafer slides by itself due to the slope and slips onto the sloping floor of the cassette 55, which floor is flush with the sloping shelf 50b. Then, the air cylinder 51 is operated so as to lower the cassette by the thickness of the wafer W so that the sloping shelf 50b becomes flush with the upper face of the first wafer W, whereby the next incoming wafer W slips onto the first wafer W without being interfered with. Thus, each time the cassette 55 receives a wafer W, the cassette 55 is lowered slightly by the air cylinder 51 until the cassette receives and is fully packed with twenty wafers W. When the cassette 55 has collected the twenty wafers W which were lapped together in the lapping assembly A, the air cylinder 51 pushes the rod 52 upward until the cassette 55 and the holder member 53 are entirely outside the recess 50a, whereupon the neck is bent at the shaft 54 so that the holder member 53 turns clockwise, as viewed in FIG. 3, and lies on the horizontal shelf with the cassette 55 lying such that its opening faces upward. Thus, it becomes easy to pick up the cassette 55 from the water. Incidentally, as the wafers W are flat and thin, they tend to glide and swim in various directions in the water; thus, the water tank 50 is designed such that its width is only slightly larger than the diameter of the wafer W so that the wafers W must land just in front of the cassette 55.

Now, when the sucking plate 43 has dropped the first wafer W, the sucking plate 43 is turned by an angle of 90° and the second wafer W which is thus caused to assume the position S4, is released and allowed to dive in the water and follow the first wafer into the cassette 55.

In this manner all of the four wafers W are discarded from the carrier 6 held by the sucking plate 43, and collected in the cassette 55 one after another. The empty carrier 6 is then cleaned and brushed with water spray, and brought to the stage S1 where it is spitted through the shaft 8 and the pin 9 by the swing arm robot 40.

Then, the arm 42 of the swing arm robot 40 reaches the stage S1' to pick up the upper-most carrier 6 there, which is loaded with four wafers W. This loaded carrier 6 is brought to the currently vacant position S3 of the lower lapping plate 2, and placed there. Then, the lower lapping plate 2 is turned by an angle of 72° again so that a next carrier 6 loaded with already lapped wafers W comes to assume the position S3. This carrier 6 is brought out from the lower lapping plate 2 and emptied at the position S2 and then left at the stage S1, exactly in the same way as the first wafer was handled. A carrier 6 loaded with unlapped wafers W is again brought in the position S3 from the stage S1', and this operation is repeated until all the carriers 6 loaded with the lapped wafers W in the lapping assembly A are replaced by the carriers 6 loaded with unlapped wafers W. Again, these unlapped wafers W are lapped in the lapping assembly A, and meanwhile the empty carriers 6 at the stage S1 are loaded with wafers W in the same manner as described earlier.

Alternatively, after the wafers W are lapped in the lapping assembly A, all the carriers 6 together with the lapped wafers W are removed from the lower lapping plate 2 one by one in the manner described above and the vacancies thus made are not immediately filled in by the replacing carriers so that the lapping assembly A is emptied. In this way it is possible to clean and brush the lapping assembly A with water spray before it is loaded again.

As described above, while a first group of wafers W are being lapped in the lapping assembly A, a second group of wafers W are set in the carriers 6 so that the wafers of the second group can replace the wafers of the first group as soon as the latter are lapped or the lapping assembly is cleaned. It is, therefore, possible to shorten the cycle time of the wafer lapping operation.

Also, in this embodiment since five carriers are piled one on top of another at the stages S1 and S1', the area taken by the waiting carriers or the emptied carriers is no more than that of one carrier so that it is possible to make compact the lapping apparatus.

Incidentally, when it is necessary to lap a certain number of wafers which is less than twenty in the lapping apparatus of the present embodiment, dummy wafers are used to make up for the short number.

What is claimed is:

1. An automatic wafer lapping apparatus having:
  a lapping assembly consisting mainly of
    an upper lapping plate,
    a lower lapping plate,
    a sun gear provided horizontally at the center of the lower lapping plate, and
    an internal gear provided horizontally along the circumference of the lower lapping plate;
  a plurality of wafer carriers which are planetary gears adapted to mesh with said sun gear and said internal gear simultaneously;
  a pair of loader assemblies each consisting mainly of
    a wafer storage to store wafers,
    a wafer picker and setter means for picking the wafers from the wafer storage and setting them in said wafer carriers, and
    a wafer carrier setter means for setting the wafer carriers at proper positions in said lapping assembly; and
  an unloader assembly consisting mainly of
    a wafer recovery subassembly for recovering the wafers, and
    a wafer carrier picker means for picking wafer carriers from said lapping assembly and discarding them into said wafer recover subassembly;
  wherein
  each of said loader assemblies further comprises a turntable stage where said wafer carriers are piled up by said wafer carrier setter means and loaded with wafers by said wafer picker and setter means, said turntable stage having a vertical central shaft and a pin on which said wafer carriers are spitted; and
  the teeth of said sun gear and the internal gear of said lapping assembly are bevelled at their upper portions in a manner such that the upper end of each tooth is tapered and converges into a linear ridge.

2. The automatic wafer lapping apparatus as claimed in claim 1 wherein said linear ridge slopes downward toward the lateral end of the tooth.

* * * * *